United States Patent
Lee et al.

(10) Patent No.: US 9,876,131 B2
(45) Date of Patent: Jan. 23, 2018

(54) INK COMPOSITION FOR MANUFACTURING LIGHT ABSORPTION LAYER OF SOLAR CELLS AND METHOD OF MANUFACTURING THIN FILM USING THE SAME

(71) Applicant: LG CHEM, LTD., Seoul (KR)

(72) Inventors: Hosub Lee, Daejeon (KR); Seokhyun Yoon, Daejeon (KR); Seokhee Yoon, Daejeon (KR); Eun Ju Park, Daejeon (KR)

(73) Assignee: LG CHEM, LTD., Seoul (KR)

( * ) Notice: Subject to any disclaimer, the term of this patent is extended or adjusted under 35 U.S.C. 154(b) by 136 days.

(21) Appl. No.: 14/899,114

(22) PCT Filed: Aug. 1, 2014

(86) PCT No.: PCT/KR2014/007093
§ 371 (c)(1),
(2) Date: Dec. 16, 2015

(87) PCT Pub. No.: WO2015/016652
PCT Pub. Date: Feb. 5, 2015

(65) Prior Publication Data
US 2016/0133768 A1 May 12, 2016

(30) Foreign Application Priority Data
Aug. 1, 2013 (KR) .................. 10-2013-0091762

(51) Int. Cl.
*C09D 11/52* (2014.01)
*H01L 31/0384* (2006.01)
(Continued)

(52) U.S. Cl.
CPC ........ *H01L 31/03845* (2013.01); *C09D 11/52* (2013.01); *H01L 21/0256* (2013.01);
(Continued)

(58) Field of Classification Search
CPC .............. C09D 11/52; H01L 21/02557; H01L 21/0256; H01L 21/02568; H01L 21/02601;
(Continued)

(56) References Cited

U.S. PATENT DOCUMENTS 9,478,684 B2 * 10/2016 Lee .................. C09D 11/52
9,525,086 B2 * 12/2016 Park .................. H01L 31/0326
(Continued)

FOREIGN PATENT DOCUMENTS

JP 2003-342602 A 12/2003
JP 2012-527401 A 11/2012
(Continued)

OTHER PUBLICATIONS

English translation of the Written Opinion of the International Search Authority dated Nov. 18, 2014 for PCT/KR2014/007093; 6 pages.*
(Continued)

*Primary Examiner* — Helene Klemanski

(57) ABSTRACT

Disclosed are an ink composition for manufacturing a light absorption layer of solar cells and a method of manufacturing a thin film using the same. Particularly, an ink composition for manufacturing a light absorption layer of solar cells including core-shell structure nanoparticles including a core including a copper (Cu)-containing chalcogenide and a shell including a zinc (Zn)-containing chalcogenide; and tin (Sn)-containing bimetallic or intermetallic metal nanoparticles, or a tin (Sn)-containing chalcogenide nanoparticles, dispersed in a solvent, and a method of manufacturing a thin film using the same are disclosed.

20 Claims, 14 Drawing Sheets

(51) Int. Cl.
*H01L 31/032* (2006.01)
*H01L 31/18* (2006.01)
*H01L 21/02* (2006.01)

(52) U.S. Cl.
CPC .. *H01L 21/02557* (2013.01); *H01L 21/02568* (2013.01); *H01L 21/02601* (2013.01); *H01L 21/02628* (2013.01); *H01L 31/0324* (2013.01); *H01L 31/0326* (2013.01); *H01L 31/18* (2013.01); *Y02E 10/50* (2013.01)

(58) Field of Classification Search
CPC ......... H01L 21/02628; H01L 31/03845; H01L 31/0324; H01L 31/0326; H01L 31/18
USPC ...................................... 106/31.92
See application file for complete search history.

(56) References Cited

U.S. PATENT DOCUMENTS

| | | | |
|---|---|---|---|
| 2008/0142075 A1* | 6/2008 | Reddy | H01L 31/0352 136/257 |
| 2010/0143702 A1 | 6/2010 | Im et al. | |
| 2011/0097496 A1 | 4/2011 | Mitzi et al. | |
| 2011/0294254 A1 | 12/2011 | Jackrel et al. | |
| 2012/0060928 A1* | 3/2012 | Johnson | H01L 21/02557 136/264 |
| 2012/0061628 A1* | 3/2012 | Johnson | H01L 21/02557 106/31.92 |
| 2012/0100660 A1 | 4/2012 | Hagedorn et al. | |
| 2013/0125988 A1 | 5/2013 | Cao et al. | |
| 2013/0164918 A1 | 6/2013 | Liang et al. | |
| 2013/0221489 A1* | 8/2013 | Cao | C09D 11/52 257/613 |
| 2016/0149061 A1* | 5/2016 | Yoon | H01L 31/0326 136/265 |
| 2016/0218231 A1* | 7/2016 | Park | H01L 31/0326 |

FOREIGN PATENT DOCUMENTS

| | | |
|---|---|---|
| TW | 200847449 A | 12/2008 |
| WO | WO 2007/134843 A2 | 11/2007 |
| WO | WO 2011/065994 A2 | 6/2011 |
| WO | WO 2012/037276 A1 | 3/2012 |
| WO | WO 2012/071287 A1 | 5/2012 |
| WO | WO 2012/112821 A1 | 8/2012 |

OTHER PUBLICATIONS

Park et al., "Synthesis of Cu2SnS3 and Cu2ZnSnS4 nanoparticles with tunable Zn/Sn ratios under multibubble sonoluminescence conditions", Dalton Trans., May 2013, 42, 10545-10550; 6 pages.*
International Search Report for PCT/KR2014/007093 filed Aug. 1, 2014.

* cited by examiner

[FIG. 1A]
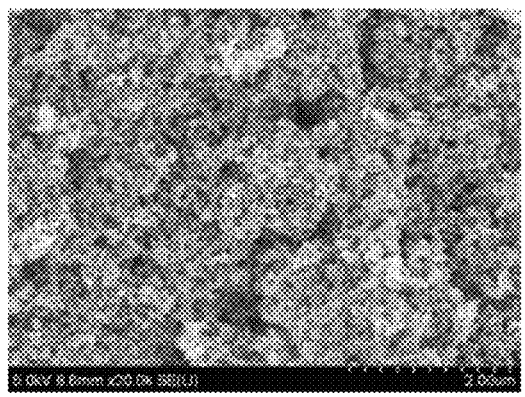
[FIG. 1B]
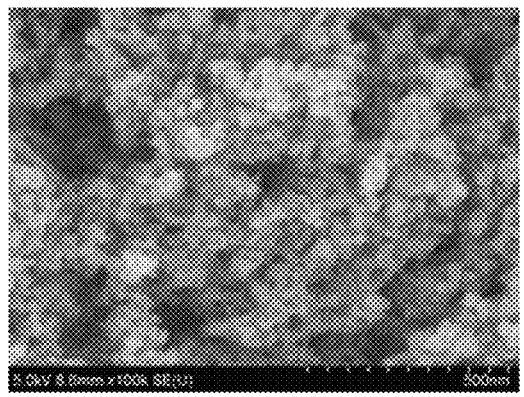
[FIG. 2]
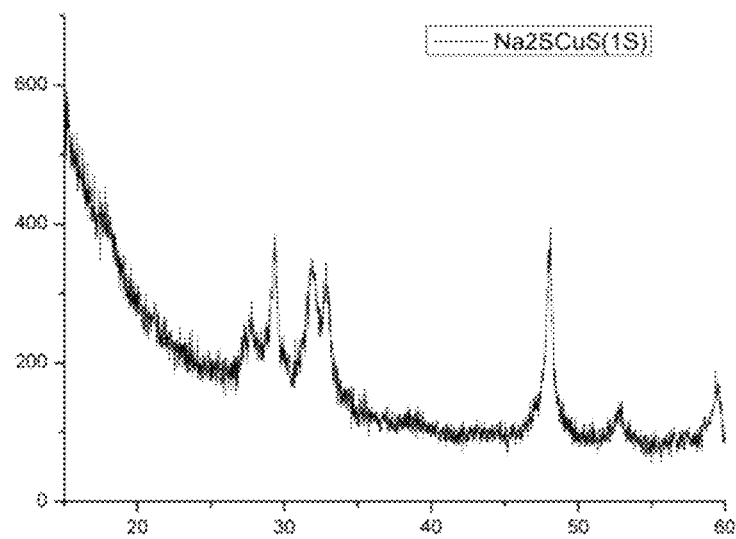

[FIG. 3A]   [FIG. 3B]
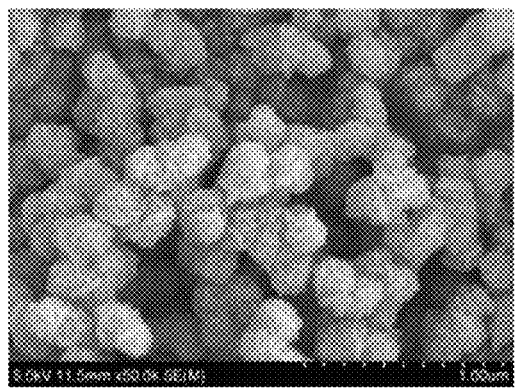 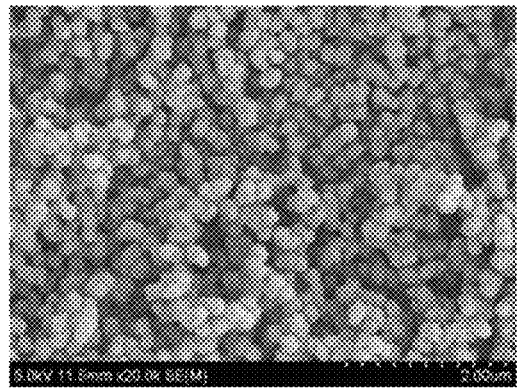
[FIG. 4]
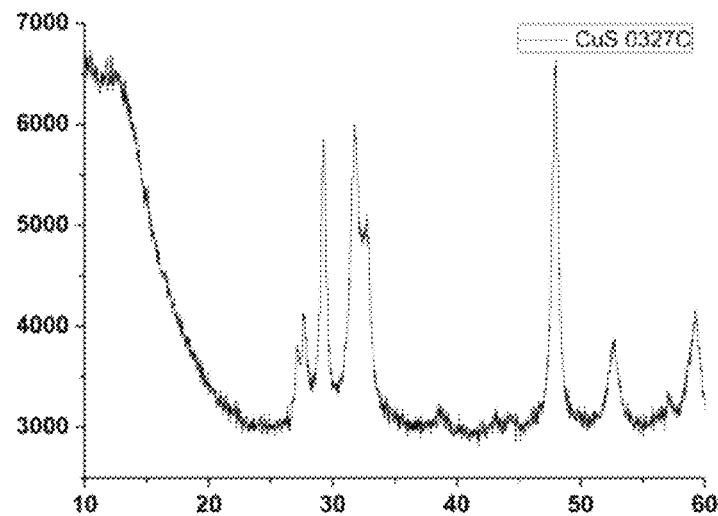

[FIG. 5A]  [FIG. 5B]
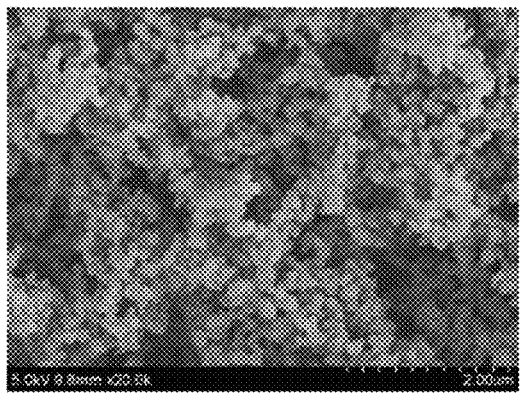 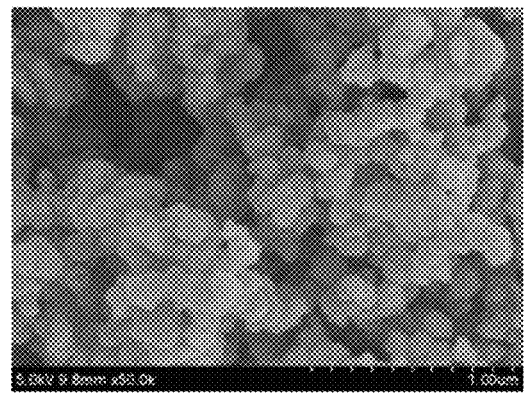
[FIG. 6]
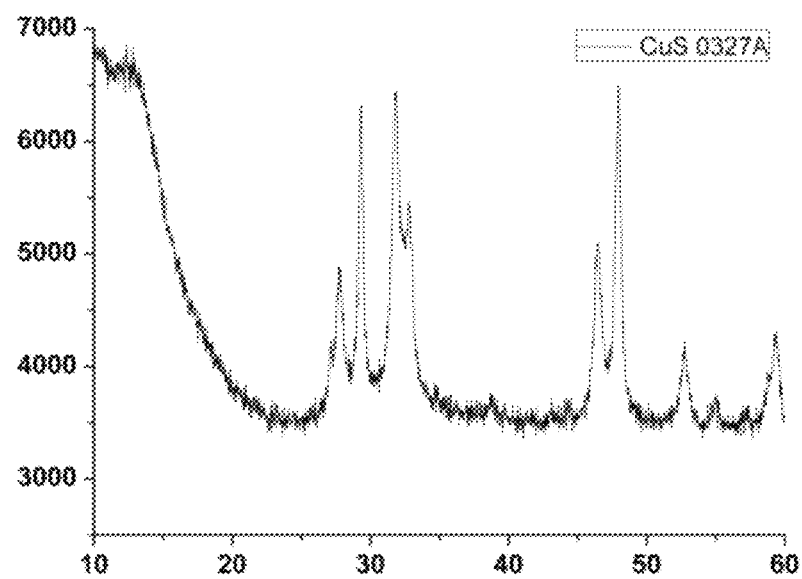

[FIG. 7A]     [FIG. 7B]
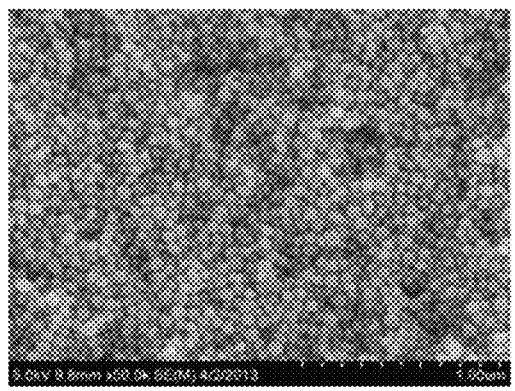 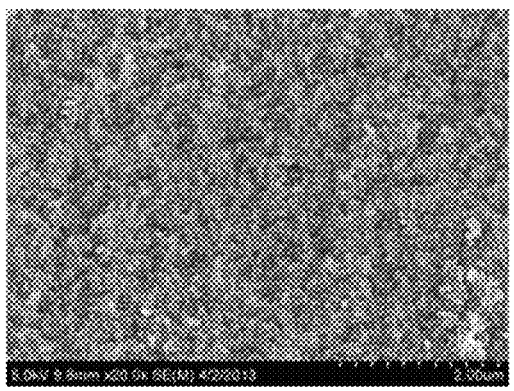
[FIG. 8]
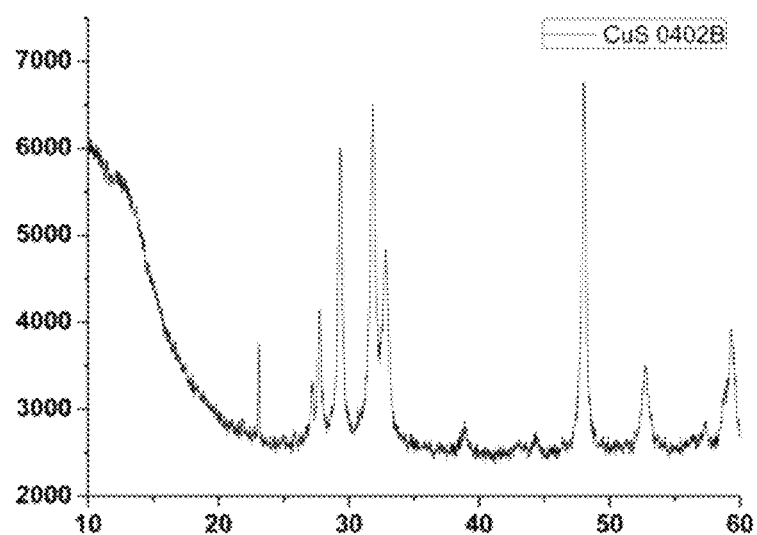

[FIG. 9A] [FIG. 9B]
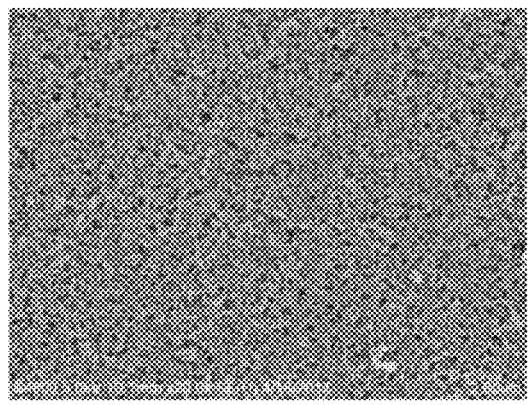
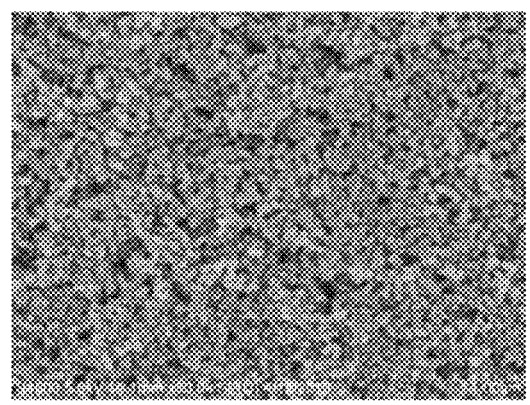
[FIG. 10]
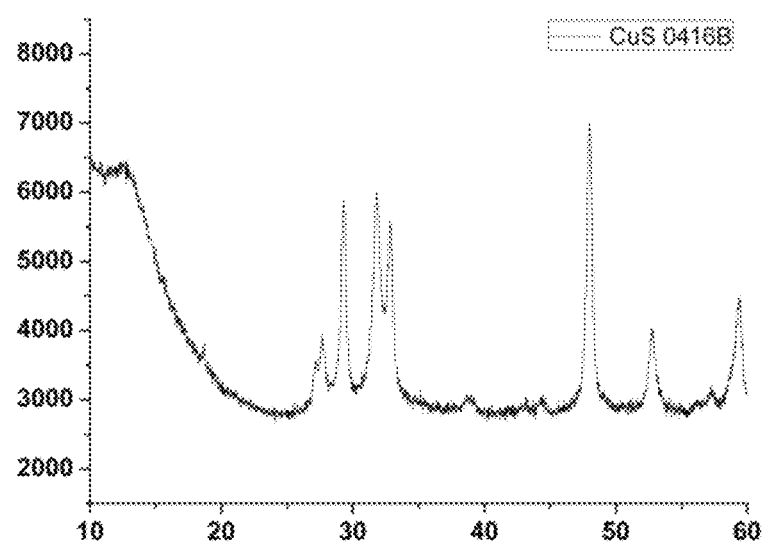

[FIG. 11A] [FIG. 11B]
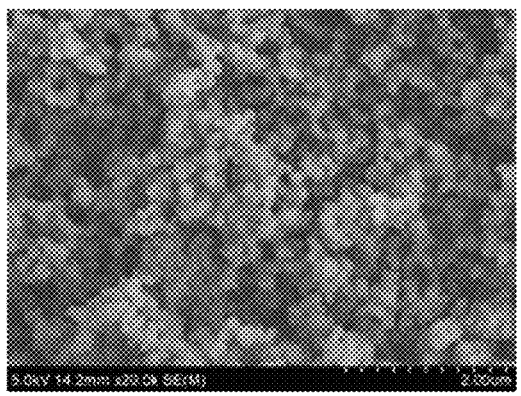 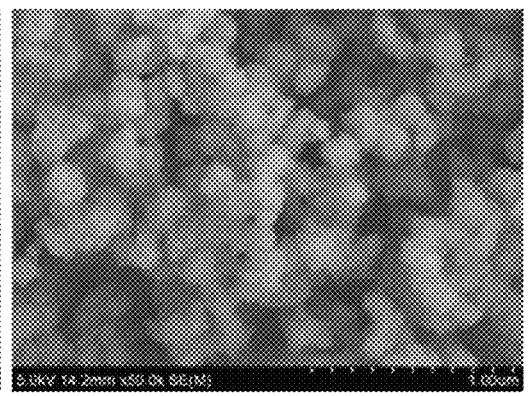
[FIG. 12]
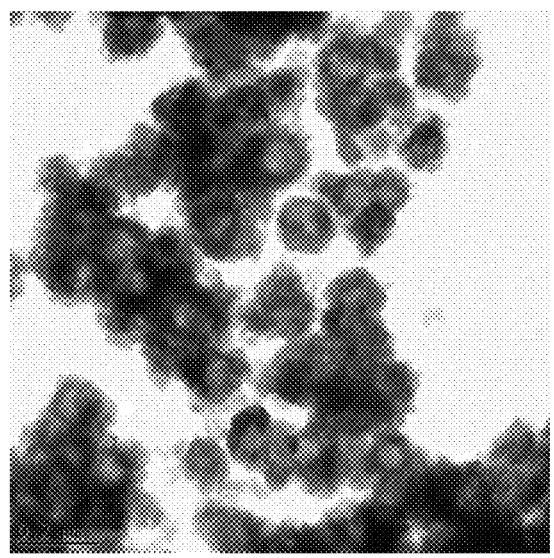

[FIG. 13A] [FIG. 13B]
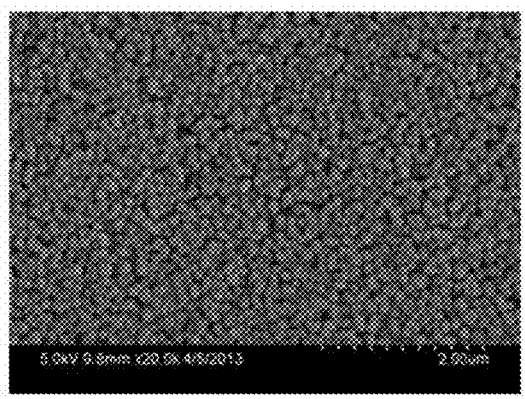 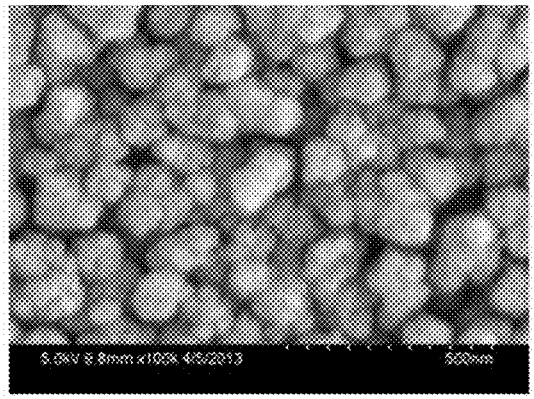
[FIG. 14]
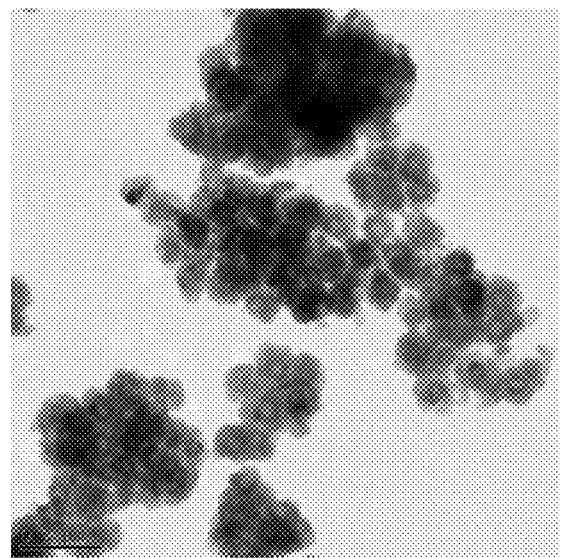

[FIG. 15A]  [FIG. 15B]
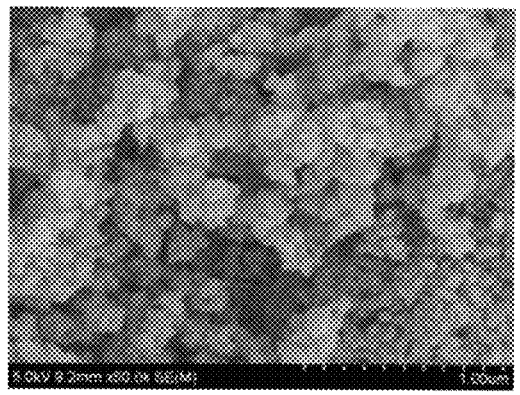
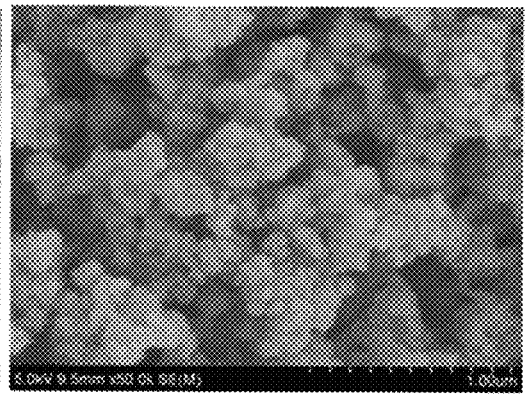
[FIG. 16]
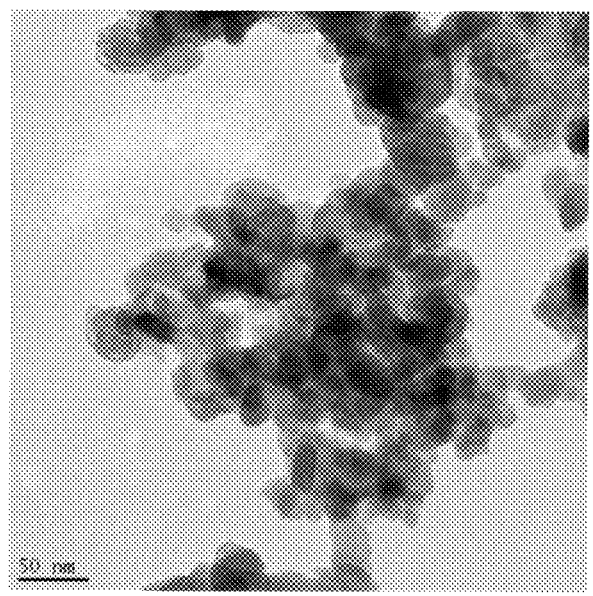

[FIG. 17A]    [FIG. 17B]
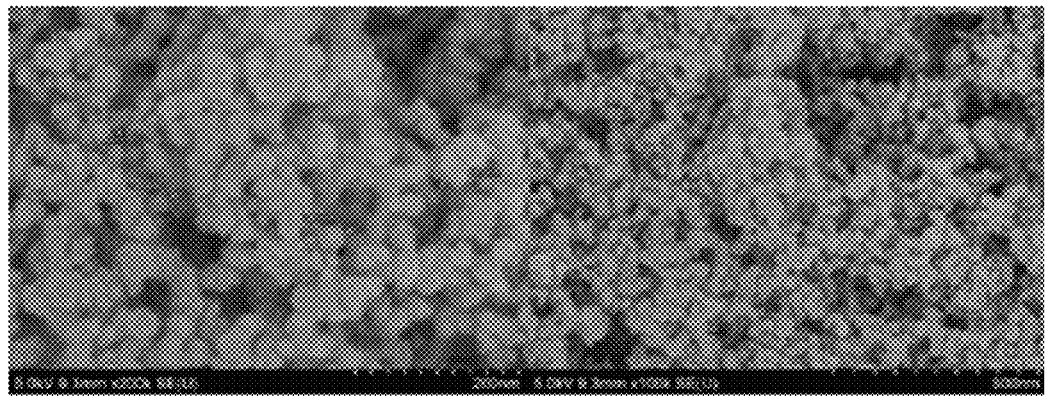
[FIG. 18]
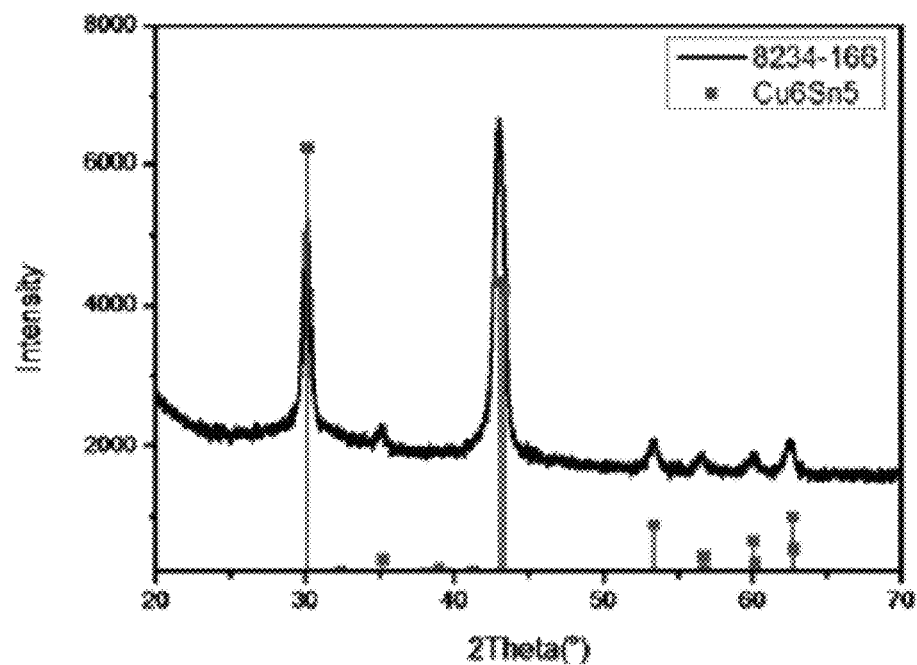

[FIG. 19A] [FIG. 19B]
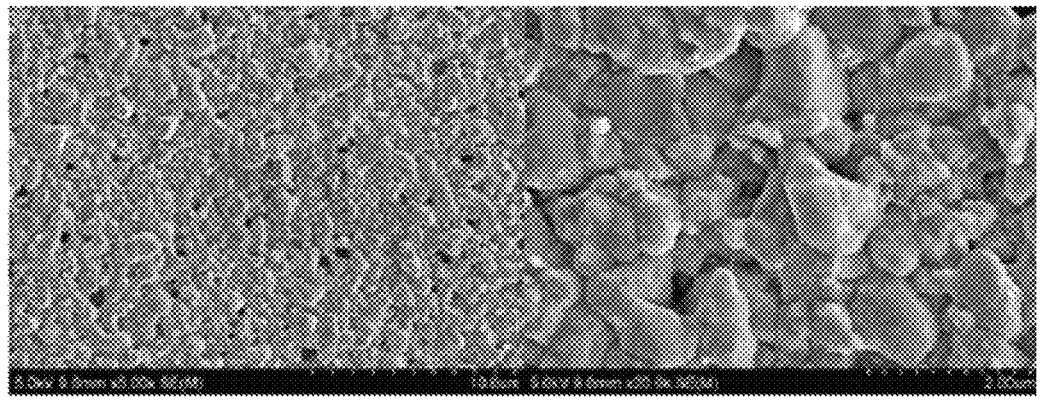
[FIG. 19C] [FIG. 19D]
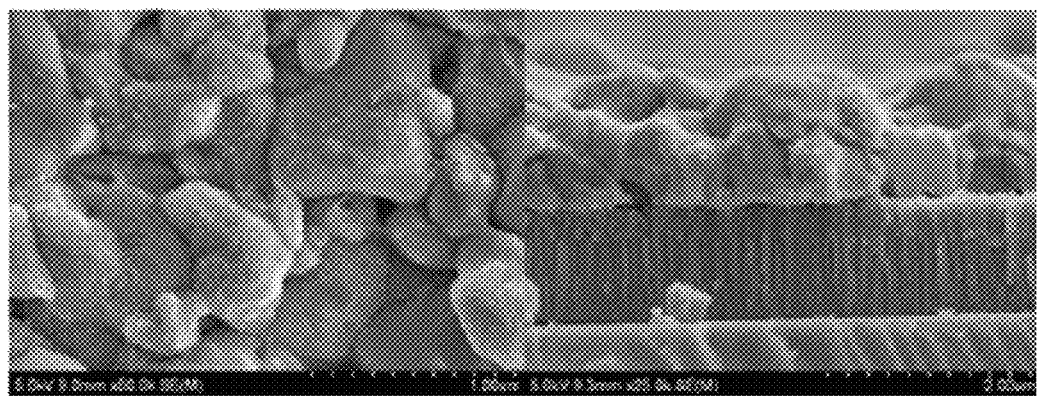

[FIG. 20]
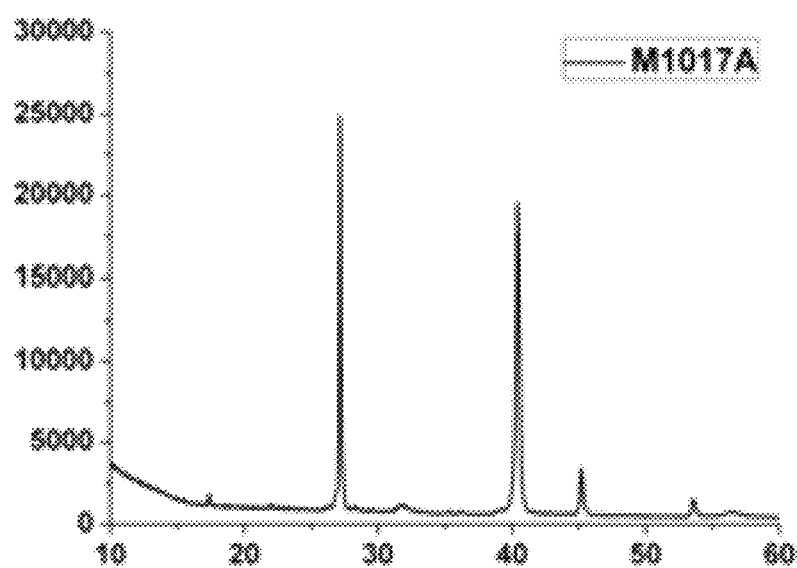

[FIG. 21A] 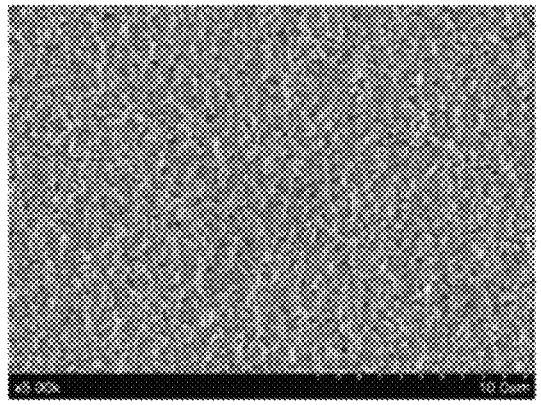
[FIG. 21B] 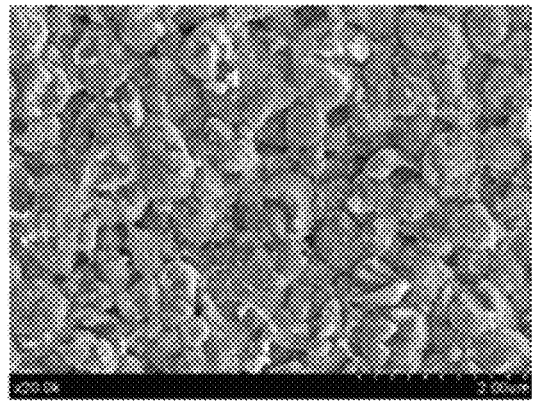
[FIG. 21C] 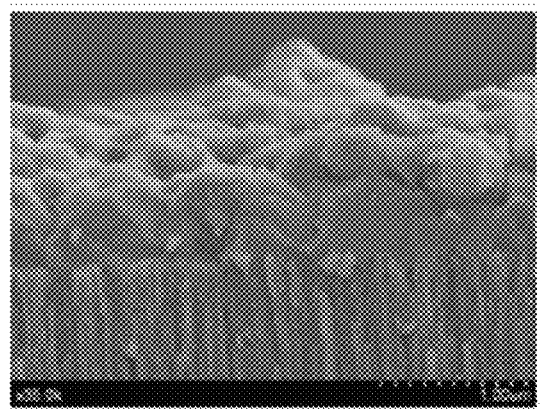

[FIG. 22]
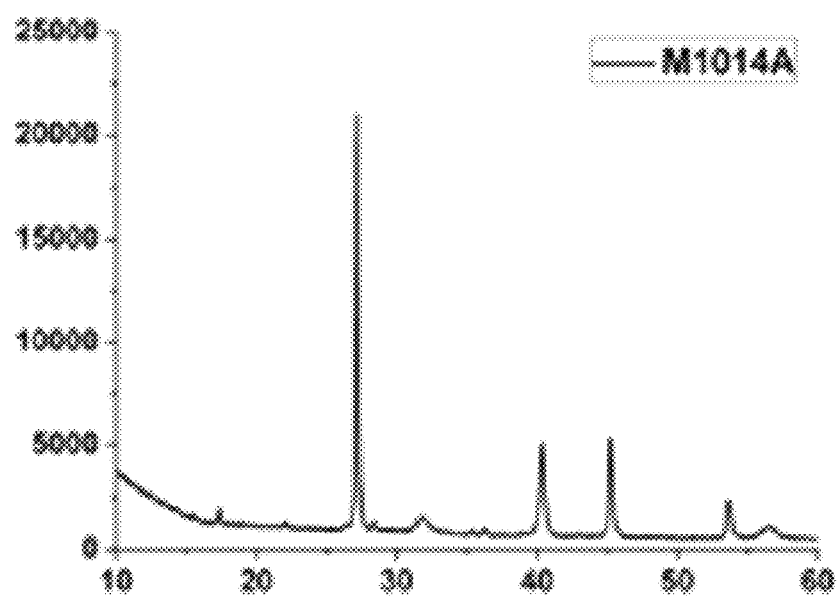

[FIG. 23A]   [FIG. 23B]
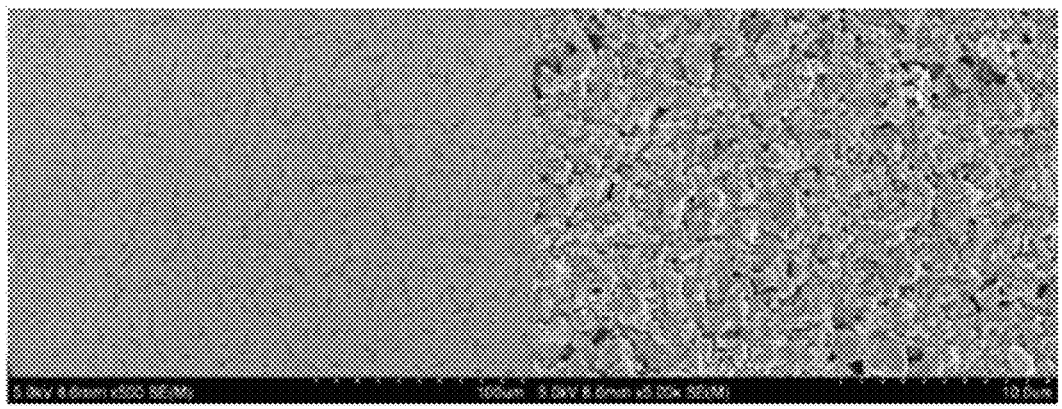
[FIG. 23C]   [FIG. 23D]
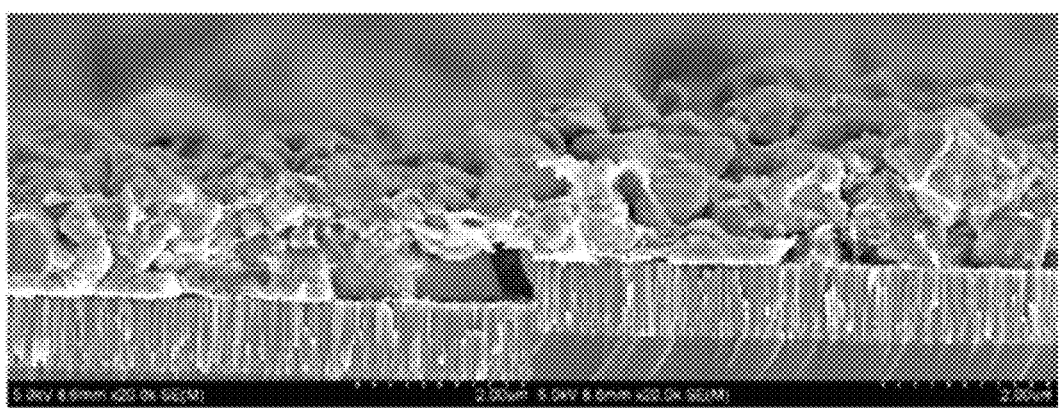

INK COMPOSITION FOR MANUFACTURING LIGHT ABSORPTION LAYER OF SOLAR CELLS AND METHOD OF MANUFACTURING THIN FILM USING THE SAME

CROSS REFERENCE TO RELATED APPLICATIONS

The present invention is a U.S. National Stage of PCT/KR2014/007093, filed Aug. 1, 2014, which claims the priority of Korean patent application No. 10-2013-0091762, filed Aug. 1, 2013, which are incorporated herein by reference.

TECHNICAL FIELD

The present invention relates to an ink composition for manufacturing a light absorption layer of solar cells and a method of manufacturing a thin film using the same. More particularly, the present invention relates to an ink composition for manufacturing a light absorption layer of solar cells including core-shell structure nanoparticles; and bimetallic or intermetallic metal nanoparticles, or metal chalcogenide nanoparticles, and a method of manufacturing a thin film using the same.

BACKGROUND ART

Solar cells have been manufactured using a light absorption layer formed at high cost and silicon (Si) as a semiconductor material since an early stage of development. To more economically manufacture commercially viable solar cells, structures of thin film solar cells, using an inexpensive light absorbing material such as copper indium gallium sulfo(di)selenide (CIGS) or $Cu(In, Ga)(S, Se)_2$, have been developed. Such CIGS-based solar cells typically include a rear electrode layer, an n-type junction part, and a p-type light absorption layer. Solar cells including such CIGS layers have a power conversion efficiency of greater than 19%. However, in spite of potential for CIGS-based thin film solar cells, costs and insufficient supply of In are main obstacles to widespread commercial application of thin film solar cells using CIGS-based light absorption layers. Thus, there is an urgent need to develop solar cells using In-free or low-cost universal elements.

Accordingly, as an alternative to the CIGS-based light absorption layer, $CZTS(Cu_2ZnSn(S,Se)_4)$-based solar cells including copper (Cu), zinc (Zn), tin (Sn), sulfur (S), or selenium (Se), which are extremely cheap elements, have recently received attention. CZTS has a direct band gap of about 1.0 eV to about 1.5 eV and an absorption coefficient of $10^4$ $cm^{-1}$ or more, reserves thereof are relatively high, and CZTS uses Sn and Zn, which are inexpensive.

In 1996, CZTS hetero junction PV batteries were reported for the first time, but CZTS-based solar cells have been advanced less than CIGS-based solar cells and photoelectric efficiency of CZTS-based solar cells is 10% or less, much lower than that of CIGS-based solar cells. Thin films of CZTS are manufactured by sputtering, hybrid sputtering, pulsed laser deposition, spray pyrolysis, electro-deposition/thermal sulfurization, e-beam processing, Cu/Zn/Sn/thermal sulfurization, and a sol-gel method.

With regard to fabrication methods, WO2007-134843 discloses a method of forming a CZTS layer by simultaneously or sequentially stacking Cu, Zn, and Sn via vacuum sputtering and heat-treating the resulting material under an S or Se atmosphere. Some papers ((Phys, Stat. Sol. C. 2006, 3, 2844. /Prog. Photovolt: Res. Appl. 2011; 19:93-96) disclose a method of forming a CZTS layer by simultaneously depositing Cu, Zn, Sn, S, or Se on a base by simultaneous vacuum evaporation. However, the above-described related art is advantageous in that deposition is performed in a relatively well-controlled state, but is disadvantageous in that manufacturing costs are high due to use of expensive equipment.

Meanwhile, PCT/US/2010-035792 discloses formation of a thin film through heat treatment of ink including CZTS/Se nanoparticles on a base. With regard to methods of forming CZTS precursor particles, Journal, J. Am. Chem. Soc., 2009, 131, 11672 discloses that CZTS nanoparticles are formed by mixing a solution including Cu, Sn and Zn precursors and a solution including S or Se at high temperature through hot injection. In addition, US2011-0097496 discloses a method of forming a CZTS layer using a precursor for forming the CZTS layer, prepared by dissolving Cu, Zn, Sn salts together with an excess of S or Se in hydrazine, through heat treatment and selenization in subsequent processes. However, hot injection has a problem regarding stability. In addition, hydrazine including a chalcogen compound containing an excess of S or Se is a highly toxic, highly reactive, highly explosive solvent and thus a solution process using hydrazine entails high risk. Furthermore, hydrazine is difficult to handle and thus there are difficulties in manufacturing processes.

Therefore, there is a high need to develop a technology for thin film solar cells including a high efficiency light absorption layer and being stable against oxidation using a fabrication method that is less expensive and safer than an existing CZTS layer preparation method.

DISCLOSURE

Technical Problem

Therefore, the present invention has been made to solve the above problems and other technical problems that have yet to be resolved.

As a result of a variety of intensive studies and various experiments, the inventors of the present invention confirmed that, when core-shell structure nanoparticles including a core including a copper (Cu)-containing chalcogenide and a shell including a zinc (Zn)-containing chalcogenide are used with tin (Sn)-containing bimetallic or intermetallic metal nanoparticles, or tin (Sn)-containing chalcogenide nanoparticles to manufacture a light absorption layer, productivity may be enhanced due to inexpensive and safe manufacturing processes, and photoelectric efficiency may be improved due to growth of a light absorption layer for CZTS based solar cells having high density and being stable against oxidation, thus completing the present invention

Technical Solution

In accordance with one aspect of the present invention, provided is a an ink composition for manufacturing a light absorption layer of solar cells including core-shell structure nanoparticles including a core including a copper (Cu)-containing chalcogenide and a shell including a zinc (Zn)-containing chalcogenide; and tin (Sn)-containing bimetallic or intermetallic metal nanoparticles, or tin (Sn)-containing chalcogenide nanoparticles, dispersed in a solvent.

Here, the term 'chalcogenide' means a material including a Group VI element, for example, sulfur (S) and/or selenium (Se).

Generally, when a CZTS thin film is formed using CZTS crystal type nanoparticles, previously formed crystals are small and, as such, it is difficult to enlarge the sizes of crystals at a subsequent thin film manufacturing process. As a result, each grain is small and thereby interfaces are enlarged, and, accordingly, electron loss occurs at the interfaces, resulting in deterioration of efficiency.

Compared with the above, when a CZTS thin film is formed with Cu, Zn and Sn, which are not a CZTS crystal and exist separately, through a second phase, each element is rearranged during a thin film formation procedure while crystals grow and, and, as such, film density and crystal sizes may be improved.

Therefore, nanoparticles used in a thin film have to include Cu, Zn and Sn, and must not be a CZTS crystal type.

Accordingly, as a result of intensive studies, the inventors of the present application confirmed that, when a thin film is formed using a core-shell structure precursor forming a stable phase due to proper mixing of two chalcogenide types and metal, with metal nanoparticles or metal chalcogenide nanoparticles which may be produced on a large scale, the above problems may be properly solved.

In a specific embodiment, the bimetallic or intermetallic metal nanoparticles which may be produced on a large scale may be $Cu_3Sn$ or $Cu_6Sn_5$ as tin (Sn)-containing bimetallic or intermetallic metal nanoparticles. The metal chalcogenide nanoparticles may be $Sn_zS$ ($0.5 \leq z \leq 2.0$) and/or $Sn_wSe$ ($0.5 \leq w \leq 2.0$) as tin (Sn)-containing chalcogenide nanoparticles and, particularly, may be at least one selected from the group consisting of SnS, $SnS_2$, SnSe and $SnSe_2$.

Here, to adjust a composition ratio of a CZTS thin film, the tin (Sn)-containing bimetallic or intermetallic metal nanoparticles, or a tin (Sn)-containing chalcogenide nanoparticles and a chalcogenide including other metal elements is additionally required. However, when a chalcogenide including Cu or a chalcogenide including Zn is respectively synthesized and mixed, a composition ratio of metal may be non-uniform. Accordingly, the inventors of the present application developed core-shell structure nanoparticles including Cu and Zn, and, as such, problems due to a non-uniform composition were resolved.

In a specific embodiment, the copper (Cu)-containing chalcogenide may be at least one selected from the group consisting of CuS, $Cu_xS$ ($1.7 \leq x \leq 2.0$), CuSe and $Cu_ySe$ ($1.7 \leq y \leq 2.0$), particularly, may be at least one selected from the group consisting of $Cu_2S$, CuS, $Cu_2Se$, and CuSe, and, more particularly, may be CuS and/or CuSe.

In addition, the zinc (Zn)-containing chalcogenide may be ZnS, and/or ZnSe.

Meanwhile, with regard to structure, when the zinc (Zn)-containing chalcogenide is a core and the copper (Cu)-containing chalcogenide is a shell, some Zn of a zinc (Zn)-containing chalcogenide core may be ionized while Cu may be easily reduced during a manufacturing process of core-shell structure nanoparticles due to different ionization tendencies of Zn and Cu. Therefore, the zinc (Zn)-containing chalcogenide core and copper (Cu)-containing chalcogenide shell are not clearly formed and a mixed form may be easily formed. Accordingly, when compared to the case that the copper (Cu)-containing chalcogenide is a core, the structure does not have any special advantages and rather zinc (Zn) ions may be disappeared.

On the other hand, as described in the present invention, when the copper (Cu)-containing chalcogenide is a core and the zinc (Zn)-containing chalcogenide is a shell, a composition ratio of a final CZTS thin film may be easily controlled by controlling the thicknesses of the core and shell, and, as such, CZTS films having a variety of composition ratios may be formed. In a specific embodiment, the diameter of the core may be 20 nanometers to 200 nanometers.

Outside this range, when the size of the core including a copper (Cu)-containing chalcogenide is too large, the sizes of core-shell structure nanoparticles including formed shells are greatly enlarged and, as such, pores among particles in a final thin film having a thickness of 1 micrometers to 2 micrometers are enlarged. On the contrary, when the diameter of a core is too small, particles may be easily condensed. In addition, to provide a final thin film having a proper composition ratio, the thickness of the shell becomes too thin, and, as such, the shell is not properly formed.

Meanwhile, the thickness of the shell is controlled by reaction time, reaction temperature and the concentrations of the reactors when, after forming a core, shell is formed on a surface of the core. Therefore, the thickness of shell formed by controlling the reaction conditions may be preferably 1 nanometer to 75 nanometers.

The thickness of the shell including the zinc (Zn)-containing chalcogenide is determined considering an entire composition ratio of a desired CZTS thin film and a composition ratio to a core. A composition ratio of Cu:Zn:Sn in a final thin film is preferably, approximately, 1.5~2.5: 0.9~1.5:1. Therefore, when a CZTS thin film is formed by mixing metal nanoparticles, a composition ratio of Cu:Zn in the core-shell structure nanoparticles may be 0.3~1.3: 0.9~1.5. Accordingly, when the diameter of the core is 20 nanometers to 200 nanometers, the thickness of the shell may be in the above range.

Meanwhile, as referred to above, a composition ratio of Cu:Zn:Sn in a final thin film is preferably, approximately, 1.5~2.5:0.9~1.5:1. Therefore, the core-shell structure nanoparticles; and tin (Sn)-containing bimetallic or intermetallic metal nanoparticles, or a tin (Sn)-containing chalcogenide nanoparticles may be mixed satisfying $0.5 < Cu/(Sn+Zn) < 1.4$.

In a specific embodiment, the solvent is not particularly limited so long as the solvent is a general organic solvent and may be one organic solvent selected from among alkanes, alkenes, alkynes, aromatics, ketones, nitriles, ethers, esters, organic halides, alcohols, amines, thiols, carboxylic acids, phosphines, phosphites, phosphates, sulfoxides, and amides or a mixture of at least one organic solvent selected therefrom.

In particular, the alcohols may be at least one mixed solvent selected from among ethanol, 1-propanol, 2-propanol, 1-pentanol, 2-pentanol, 1-hexanol, 2-hexanol, 3-hexanol, heptanol, octanol, ethylene glycol (EG), diethylene glycol monoethyl ether (DEGMEE), ethylene glycol monomethyl ether (EGMME), ethylene glycol monoethyl ether (EGMEE), ethylene glycol dimethyl ether (EGDME), ethylene glycol diethyl ether (EGDEE), ethylene glycol monopropyl ether (EGMPE), ethylene glycol monobutyl ether (EGMBE), 2-methyl-1-propanol, cyclopentanol, cyclohexanol, propylene glycol propyl ether (PGPE), diethylene glycol dimethyl ether (DEGDME), 1,2-propanediol (1,2-PD), 1,3-propanediol (1,3-PD), 1,4-butanediol (1,4-BD), 1,3-butanediol (1,3-BD), α-terpineol, diethylene glycol (DEG), glycerol, 2-(ethylamino)ethanol, 2-(methylamino)ethanol, and 2-amino-2-methyl-1-propanol.

The amines may be at least one mixed solvent selected from among triethyl amine, dibutyl amine, dipropyl amine, butylamine, ethanolamine, diethylenetriamine (DETA), triethylenetetramine (TETA), triethanolamine, 2-aminoethyl piperazine, 2-hydroxyethyl piperazine, dibutylamine, and tris(2-aminoethyl)amine.

The thiols may be at least one mixed solvent selected from among 1,2-ethanedithiol, pentanethiol, hexanethiol, and mercaptoethanol.

The alkanes may be at least one mixed solvent selected from among hexane, heptane, and octane.

The aromatics may be at least one mixed solvent selected from among toluene, xylene, nitrobenzene, and pyridine.

The organic halides may be at least one mixed solvent selected from among chloroform, methylene chloride, tetrachloromethane, dichloroethane, and chlorobenzene.

The nitriles may be acetonitrile.

The ketones may be at least one mixed solvent selected from among acetone, cyclohexanone, cyclopentanone, and acetyl acetone.

The ethers may be at least one mixed solvent selected from among ethyl ether, tetrahydrofuran, and 1,4-dioxane.

The sulfoxides may be at least one mixed solvent selected from among dimethyl sulfoxide (DMSO) and sulfolane.

The amides may be at least one mixed solvent selected from among dimethyl formamide (DMF) and n-methyl-2-pyrrolidone (NMP).

The esters may be at least one mixed solvent selected from among ethyl lactate, γ-butyrolactone, and ethyl acetoacetate.

The carboxylic acids may be at least one mixed solvent selected from among propionic acid, hexanoic acid, meso-2,3-dimercaptosuccinic acid, thiolactic acid, and thioglycolic acid.

However, the solvents are only given as an example, and embodiments of the present invention are not limited thereto.

In some cases, the ink composition may be manufactured by further adding an additive.

The additive may, for example, be at least one selected from the group consisting of a dispersant, a surfactant, a polymer, a binder, a crosslinking agent, an emulsifying agent, an anti-foaming agent, a drying agent, a filler, a bulking agent, a thickening agent, a film conditioning agent, an antioxidant, a fluidizer, a leveling agent, and a corrosion inhibitor. In particular, the additive may be at least one selected from the group consisting of polyvinylpyrrolidone (PVP), polyvinylalcohol, Anti-terra 204, Anti-terra 205, ethyl cellulose, and DispersBYK110.

The present invention also provides a method of manufacturing the core-shell structure nanoparticles, the method including:

(i) preparing a first solution including at least one Group VI source selected from the group consisting of compounds comprising sulfur (S), or selenium (Se), or sulfur (S) and selenium (Se);

(ii) preparing a second solution including a copper (Cu) salt and a third solution including a zinc (Zn) salt;

(iii) mixing the first solution and second solution to manufacture a mixture;

(iv) synthesizing copper (Cu)-containing chalcogenide core particles through reaction of the mixture; and (v) forming and then purifying a shell by mixing the third solution with a product including the core particles of the synthesizing.

In a specific embodiment, solvents of the first solution, second solution and third solution each independently may be at least one selected from the group consisting of water, methanol, ethanol, glycol class solvents, oleylamine, dimethyl sulfoxide and dimethyl formamide.

The glycol class solvents, which are not limited specifically, may be at least one selected from the group consisting of, for example, ethylene glycol, diethylene glycol, NMP, diethylene glycol mono ethyl ether (DEGMEE) and triethylene glycol.

In a specific embodiment, the Group VI source included in the first solution may be at least one selected from the group consisting of Se, $Na_2Se$, $K_2Se$, $Ca_2Se$, $(CH_3)_2Se$, $SeO2$, $SeCl_4$, $H_2SeO_3$, $Na_2S$, $K_2S$, $Ca_2S$, $(CH_3)_2S$, $H_2SO_4$, S, $Na_2S_2O_3$, $NH_2SO_3H$ and hydrates thereof, or may be at least one selected from the group consisting of thiourea, thioacetamide, and selenourea as organic matters.

In a specific embodiment, the salts included in the second solution and the third solution may be at least one type selected from the group consisting of chloride, nitrate, nitrite, sulfate, acetate, sulfite, acetylacetonate and a hydroxide.

Meanwhile, when the first solution is mixed with the second solution as described in step (iii), the Group VI source may be included in an amount of 0.5 mol or more, particularly a desired amount in a range of 0.5 mol to 4 mol, based on 1 mol of a copper (Cu) salt.

Outside the above range, when the Group VI source is included in an amount of less than 0.5 mol, sufficient supply of the Group VI element is impossible and thereby stable phases such as CuS(Se) or $Cu_2S(Se)$ are not formed, and, accordingly, phases may changed or separated metals may be oxidized at subsequent processes.

In addition, when the Group VI source is included in an amount of greater than 4 mol, generation of an undesired Group VI element is increased and the Group VI source is evaporated in a heat treatment process to manufacture a thin film, and, as such, pores may be excessively generated in a final thin film.

Here, by stirring the mixture while slowly adding the second solution to the first solution dropwise, copper (Cu)-containing chalcogenide core particles having a uniform composition and particle size may be obtained.

In addition, as described in step (v), copper (Cu)-containing chalcogenide particles, as core particles, manufactured through step (v) may be mixed with the third solution including the zinc (Zn) salt to form shells on surfaces of the core particles.

Here, in the mixing process, the thickness of the shell may be determined by the concentration of the zinc (Zn) salt. Accordingly, the concentration of the zinc (Zn) salt may be properly determined by a composition ratio of a final thin film.

In a specific embodiment, in a mixing process of the third solution, to resolve partial deficiency of the Group VI element in a subsequent CZTS layer formation process, a Group VI source may be additionally added. Here, the Group VI source may be added considering the amount of a Group VI element remaining in a previous copper (Cu)-containing chalcogenide core particle formation process.

Meanwhile, the tin (Sn)-containing bimetallic or intermetallic metal nanoparticles may be manufactured using a reducing agent. A method of forming the Cu—Sn bimetallic metal nanoparticles, for example, includes:

(i) preparing a first solution including a reducing agent;

(ii) preparing a second solution including a copper (Cu) salt and tin (Sn) salt;

(iii) adding the second solution to the first solution dropwise to manufacture a mixture; and (iv) synthesizing and then purifying one or more types of Cu—Sn bimetallic metal nanoparticles through reaction of the mixture.

Here, the reducing agent is not toxic hydrazine and may be an organic reducing agent and/or inorganic reducing agent. Particularly, the reducing agent may be one selected from the group consisting of $LiBH_4$, $NaBH_4$, $KBH_4$, $Ca(BH_4)_2$, $Mg(BH_4)_2$, $LiB(Et)_3H$, $NaBH_3(CN)$, $NaBH(OAc)_3$, ascorbic acid and triethanolamine. Solvent and salt types of the solution are identical to those described above.

When the second solution is added dropwise to the first solution to manufacture a mixture, a mixing ratio of the reducing agent to the total amount of the salts may be, for example, 1:1 to 1:20, in a molar ratio.

When the amount of the reducing agent is too small, compared to the amount of salts, metal salts are not sufficiently reduced. Accordingly, the sizes or amounts of obtained bimetallic metal nanoparticles may be too small, or it is difficult to obtain particles having a desired element ratio. In addition, when the amount of the reducing agent is greater 20 times than the amount of the salt, reducing agents and by-products are not efficiently removed in a purification step.

The amounts of the salts included may be properly determined considering a desired amount in a final product.

In addition, the first solution and/or second solution may further include a capping agent or the like to prevent oxidization of metal nanoparticles.

The above manufacturing method is merely one example. Metal types of the metal salts may be variously selected according to desired metal nanoparticles.

In addition, a method of manufacturing the tin (Sn)-containing chalcogenide nanoparticles is the same as the method of manufacturing the copper (Cu)-containing chalcogenide core particles except that a tin (Sn) salt instead of the copper (Cu) salt is used.

Meanwhile, the inventors of the present application confirmed that the core-shell structure nanoparticles manufactured as described above are stable against oxidation and have superior reactivity. Accordingly, as a result of intensive studies, the inventors of the present application confirmed that, when a light absorption layer is manufactured using the core-shell structure nanoparticles; and the tin (Sn)-containing bimetallic or intermetallic metal nanoparticles, or a tin (Sn)-containing chalcogenide nanoparticles, more superior quality film is produced.

Accordingly, the invention also provides a method of manufacturing the thin film using the ink composition for manufacturing a light absorption layer of solar cells, the method including:

(i) manufacturing an ink core-shell structure nanoparticles; and tin (Sn)-containing bimetallic or intermetallic metal nanoparticles, or a tin (Sn)-containing chalcogenide nanoparticles with a solvent;

(ii) coating the ink on a base provided with an electrode; and (iii) drying and then heat-treating the ink coated on the base provided with an electrode.

A method of forming the coating layer of step (ii) may, for example, be any one selected from the group consisting of wet coating, spray coating, spin-coating, doctor blade coating, contact printing, top feed reverse printing, bottom feed reverse printing, nozzle feed reverse printing, gravure printing, micro gravure printing, reverse micro gravure printing, roller coating, slot die coating, capillary coating, inkjet-printing, jet deposition, and spray deposition.

The heat treatment of step (iii) may be carried out at a temperature of 400 to 900° C.

Meanwhile, a selenization process may be included to prepare the thin film of a solar cell having much higher density. The selenization process may be carried out through a variety of methods.

As a first example, effects obtained from the selenization process may be achieved by manufacturing an ink by dispersing S and/or Se to particle types in a solvent with core-shell structure nanoparticles; and tin (Sn)-containing bimetallic or intermetallic metal nanoparticles, or a tin (Sn)-containing chalcogenide nanoparticles in step (i), and by combining the heat treatment of step (iii).

As a second example, effects obtained from the selenization process may be achieved through the heat treatment of step (iii) in the presence of S or Se In particular, S or Se may be present by supplying $H_2S$ or $H_2Se$ in a gaseous state or supplying Se or S in a gaseous state through heating.

As a third example, after step (ii), S or Se may be stacked on the coated base, following by performing step (iii). In particular, the stacking process may be performed by a solution process or a deposition method The present invention also provides a thin film manufactured using the above-described method.

The thin film may have a thickness of 0.5 μm to 3.0 μm, more particularly 0.5 μm to 2.5 μm When the thickness of the thin film is less than 0.5 μm, the density and amount of the light absorption layer are insufficient and thus desired photoelectric efficiency may not be obtained. On the other hand, when the thickness of the thin film exceeds 3.0 μm, movement distances of carriers increases and, accordingly, there is an increasing probability of recombination, which results in reduced efficiency.

The present invention also provides a thin film solar cell manufactured using the thin film.

A method of manufacturing a thin film solar cell is known in the art and thus a detailed description thereof will be omitted herein.

BRIEF DESCRIPTION OF THE DRAWINGS

The above and other objects, features and other advantages of the present invention will be more clearly understood from the following detailed description taken in conjunction with the accompanying drawing, in which:

FIGS. 1A-1B are scanning electron microscope (SEM) images of CuS nanoparticles manufactured according to Manufacturing Example 1;

FIG. 2 is an X-ray diffraction (XRD) graph of CuS nanoparticles manufactured according to Manufacturing Example 1;

FIGS. 3A-3B are scanning electron microscope (SEM) images of CuS nanoparticles manufactured according to Manufacturing Example 5;

FIG. 4 is an X-ray diffraction (XRD) graph of CuS nanoparticles manufactured according to Manufacturing Example 5;

FIGS. 5A-5B are scanning electron microscope (SEM) images of CuS nanoparticles manufactured according to Manufacturing Example 8;

FIG. 6 is an X-ray diffraction (XRD) graph of CuS nanoparticles manufactured according to Manufacturing Example 8;

FIGS. 7A-7B are scanning electron microscope (SEM) images of CuS nanoparticles manufactured according to Manufacturing Example 12;

FIG. 8 is an X-ray diffraction (XRD) graph of CuS nanoparticles manufactured according to Manufacturing Example 12;

FIGS. 9A-9B are scanning electron microscope (SEM) images of CuS nanoparticles manufactured according to Manufacturing Example 13;

FIG. 10 is an X-ray diffraction (XRD) graph of CuS nanoparticles manufactured according to Manufacturing Example 13;

FIGS. 11A-11B are scanning electron microscope (SEM) images of CuS-core-ZnS-shell nanoparticles manufactured according to Manufacturing Example 17;

FIG. 12 is a transmission electron microscope (TEM) image of CuS-core-ZnS-shell nanoparticles manufactured according to Manufacturing Example 17;

FIGS. 13A-13B are scanning electron microscope (SEM) images of CuS-core-ZnS-shell nanoparticles manufactured according to Manufacturing Example 18;

FIG. 14 is a transmission electron microscope (TEM) image of CuS-core-ZnS-shell nanoparticles manufactured according to Manufacturing Example 18;

FIGS. 15A-15B are scanning electron microscope (SEM) images of CuS-core-ZnS-shell nanoparticles manufactured according to Manufacturing Example 19;

FIG. 16 is a transmission electron microscope (TEM) image of CuS-core-ZnS-shell nanoparticles manufactured according to Manufacturing Example 19;

FIGS. 17A-17B are scanning electron microscope (SEM) images of $Cu_6Sn_5$ particles manufactured according to Manufacturing Example 22;

FIG. 18 is an XRD graph of $Cu_6Sn_5$ particles manufactured according to Manufacturing Example 22;

FIGS. 19A-19D are scanning electron microscope (SEM) images of a CZTSSe thin film formed according to Example 1;

FIG. 20 is X-ray diffraction (XRD) graph of a CZTSSe thin film formed according to Example 1;

FIGS. 21A-21C are scanning electron microscope (SEM) images of a CZTSSe thin film formed according to Example 2;

FIG. 22 is an X-ray diffraction (XRD) graph of a CZTSSe thin film formed according to Example 2; and FIGS. 23A-23D are scanning electron microscope (SEM) images of a CZTSSe thin film formed according to Comparative Example 1.

BEST MODE

Now, the present invention will be described in more detail with reference to the following examples. These examples are provided only for illustration of the present invention and should not be construed as limiting the scope and spirit of the present invention.

Manufacturing Example 1

Synthesis of CuS Particles

To 150 mL of an aqueous solution including 5 mmol $Na_2S$, 100 mL of an aqueous solution including 5 mmol of $Cu(NO_3)_2$ was added dropwise. Subsequently, the solution was reacted while stirring for 2 hours. Formed particles were purified through centrifugation, resulting in CuS nanoparticles. A scanning electron microscope (SEM) image and XRD graph of the formed particles are illustrated in FIGS. 1 and 2.

Manufacturing Example 2

Synthesis of CuS Particles 200 mL of an aqueous solution including 5 mmol of $Cu(NO_3)_2$ and 10 mmol of thioacetamide was heated to 80° C. or more while stirring. Maintaining the temperature, the solution was reacted while stirring for 3 hours. Formed particles were purified through centrifugation, resulting in CuS nanoparticles.

Manufacturing Example 3

Synthesis of CuS Particles 60 mL of an aqueous solution including 5 mmol of $CuCl_2$ was heated to 80° C. or more. Subsequently, 60 mL of an aqueous solution including 10 mmol of thioacetamide was slowly added thereto and then was reacted while stirring for 3 hours. Formed particles were purified through centrifugation, resulting in CuS nanoparticles.

Manufacturing Example 4

Synthesis of CuS Particles 60 ml of a diethylene glycol (DEG) solution including 5 mmol of $Cu(NO_3)_2$ was heated to 60° C. or more. Subsequently, 60 ml of a DEG solution including 10 mmol of thioacetamide was added dropwise and then was reacted while stirring for 1 hour at 60° C. Formed particles were purified through centrifugation, resulting in CuS nanoparticles.

Manufacturing Example 5

Synthesis of CuS Particles 300 ml of a DEG solution including 5 mmol of $Cu(NO_3)_2$ was heated to 120° C. Subsequently, 100 mL of a DEG solution including 10 mmol of thioacetamide was added dropwise and then was reacted while stirring for 3 hours at 120° C. Formed particles were purified through centrifugation, resulting in CuS nanoparticles. A scanning electron microscope (SEM) image and XRD graph of the formed particles are illustrated in FIGS. 3 and 4.

Manufacturing Example 6

Synthesis of CuS Particles 80 mL of an ethylene glycol (EG) solution including 5 mmol of $Cu(NO_3)_2$ and 10 mmol of thioacetamide was heated to 100° C. Subsequently, maintaining the temperature, the solution was reacted while stirring for 3 hours. Formed particles were purified through centrifugation, resulting in CuS nanoparticles.

Manufacturing Example 7

Synthesis of CuS Particles 200 mL of a DEG solution was heated to 120° C. or more and then added dropwise to 50 mL of a DEG solution including 10 mmol of thioacetamide. Subsequently, 50 mL of a DEG solution including 5 mmol of $Cu(NO_3)_2$ was added dropwise thereto. Maintaining the temperature, the solution was reacted while stirring for 3 hours. Formed particles were purified through centrifugation, resulting in CuS nanoparticles.

Manufacturing Example 8

Synthesis of CuS Particles 250 mL of an EG solution including 5 mmol of $Cu(NO_3)_2$ was heated to 170° C. or more and then 50 mL of an EG solution including 10 mmol of thioacetamide was added dropwise thereto. Subsequently, maintaining the temperature, the solution was reacted while stirring for 3 hours. Formed particles were purified through centrifugation, resulting in CuS nanoparticles. A scanning electron microscope (SEM) image and XRD graph of the formed particles are illustrated in FIGS. 5 and 6.

Manufacturing Example 9

Synthesis of CuS Particles 250 ml of a DEG solution including 5 mmol of $Cu(NO_3)_2$ was heated to 170° C. or more. Subsequently, 50 mL of a DEG solution including 10 mmol of thioacetamide was added dropwise thereto. Subsequently, maintaining the temperature, the solution was reacted while stirring for 3 hours. Formed particles were purified through centrifugation, resulting in CuS nanoparticles.

Manufacturing Example 10

Synthesis of CuS Particles 200 mL of a dimethyl formamide (DMF) solution was heated to 120° C. or more and then 50 mL of a DMF solution including 10 mmol of thioacetamide was added dropwise. Subsequently, 50 mL of a DMF solution including 5 mmol of $Cu(NO_3)_2$ was added dropwise and then, maintaining the temperature, the solution was reacted while stirring for 3 hours. Formed particles were purified through centrifugation, resulting in CuS nanoparticles.

Manufacturing Example 11

Synthesis of CuS Particles 250 mL of an aqueous solution including 5 mmol of $Cu(NO_3)_2$ was heated to 170° C. or more and then 50 ml of an EG solution including 10 mmol of thioacetamide was added dropwise. Subsequently, maintaining the temperature, the solution was reacted while stirring for 3 hours. Formed particles were purified through centrifugation, resulting in CuS nanoparticles.

Manufacturing Example 12

Synthesis of CuS particles 200 ml of a DEG solution including 3 g of PVP was heated to 120° C. or more and then 50 mL of a DEG solution including 10 mmol of thioacetamide was added dropwise thereto. Subsequently, 50 ml of a DEG solution including 5 mmol of $Cu(NO_3)_2$ was added dropwise and then, maintaining the temperature, the solution was reacted while stirring for 3 hours. Formed particles were purified through centrifugation, resulting in CuS nanoparticles. A scanning electron microscope (SEM) image and XRD graph of the formed particles are illustrated in FIGS. 7 and 8.

Manufacturing Example 13

Synthesis of CuS Particles 200 mL of a DEG solution including 1 g of dodecylamine was heated to 120° C. or more and then 50 mL of a DEG solution including 10 mmol of thioacetamide was added dropwise thereto. Subsequently, 50 ml of a DEG solution including 5 mmol of $Cu(NO_3)_2$ was added dropwise and then, maintaining the temperature, the solution was reacted while stirring for 3 hours. Formed particles were purified through centrifugation, resulting in CuS nanoparticles. A scanning electron microscope (SEM) image and X-ray diffraction (XRD) graph for the formed particles are illustrated in FIGS. 9 and 10.

Manufacturing Example 14

Synthesis of CuS Particles

To 100 mL of an aqueous solution including 5 mmol of sodium thiosulfate, 100 mL of an aqueous solution including 50 mmol of citric acid was added dropwise and then was heated to 80° C. or more. Subsequently, 50 mL of an aqueous solution including 5 mmol of $Cu(NO_3)_2$ was added dropwise and then, maintaining the temperature, the solution was reacted while stirring for 3 hours. Formed particles were purified through centrifugation, resulting in CuS nanoparticles.

Manufacturing Example 15

Synthesis of CuS Particles

To 100 mL of an EG solution including 5 mmol of sodium thiosulfate, 100 mL of an EG solution including 50 mmol of citric acid was added dropwise and then heated to 80° C. or more. Subsequently, 50 mL of an EG solution including 5 mmol of $Cu(NO_3)_2$ was added dropwise thereto. Subsequently, maintaining the temperature, the solution was reacted while stirring for 3 hours. Formed particles were purified through centrifugation, resulting in CuS nanoparticles.

Manufacturing Example 16

Synthesis of CuS Particles 100 mL of an EG solution including 5 mmol of thiourea was heated to 80° C. or more and then 100 mL of an EG solution including 5 mmol of $Cu(NO_3)_2$ was added dropwise. Subsequently, maintaining the temperature, the solution was reacted while stirring for 3 hours. Formed particles were purified through centrifugation, resulting in CuS nanoparticles.

Manufacturing Example 17

Synthesis of CuS-Core-ZnS-Shell Nanoparticles

To 5 mmol of CuS nanoparticles synthesized according to Example 5, 100 ml of a DEG solution including 10 mmol of thioacetamide and 8 mmol of $ZnCl_2$ was added dropwise at room temperature. The resulting solution was heated to 80° C. or more and, maintaining the temperature, stirred for 3 hours. Subsequently, the formed particles were purified through centrifugation. As a result, ZnS shells were formed on surfaces of the CuS nanoparticles. Scanning electron microscope (SEM) and transmission electron microscope (TEM) images of the formed particles are illustrated in FIGS. 11 and 12.

Manufacturing Example 18

Synthesis of CuS-Core-ZnS-Shell Nanoparticles 100 mL of a DEG solution including 5 mmol of CuS nanoparticles synthesized according to Example 12 was heated to 80° C. or more and then 50 mL of a DEG solution including 16 mmol of thioacetamide and 50 mL of a DEG solution including 8 mmol of $ZnCl_2$ were added dropwise thereto. Subsequently, maintaining the temperature, the resulting mixture was stirred for 3 hours. Formed particles were purified through centrifugation. As a result, ZnS shells were formed on surfaces of the CuS nanoparticles. Scanning electron microscope (SEM) and transmission electron microscope (TEM) images of the formed particles are illustrated in FIGS. 13 and 14.

Manufacturing Example 19

Synthesis of CuS-Core-ZnS-Shell Nanoparticles

To 5 mmol of CuS nanoparticles synthesized according to Example 12, 150 ml of a DEG solution including 16 mmol of thiourea and 8 mmol of $Zn(OAc)_2$ was added dropwise. The resulting solution was heated to 150° C. or more and, maintaining the temperature, stirred for 3 hours. Subsequently, the formed particles were purified through centrifugation. As a result, ZnS shells were formed on surfaces of the CuS nanoparticles.

Manufacturing Example 20

Synthesis of CuS-Core-ZnS-Shell Nanoparticles 100 mL of a DEG solution including 16 mmol of thioacetamide was added to 5 mmol of CuS nanoparticles synthesized according to Example 13 and then was heated to 100° C. or more. Subsequently, 50 mL of a DEG solution including 8 mmol of $ZnCl_2$ was added dropwise thereto. Subsequently, maintaining the temperature, the resulting mixture was stirred for 3 hours. Formed particles were purified through centrifugation. As a result, ZnS shells were formed on surfaces of the CuS nanoparticles. Scanning electron microscope (SEM) and transmission electron microscope (TEM) images of the formed particles are illustrated in FIGS. 15 and 16.

Manufacturing Example 21

Synthesis of CuS-Core-ZnS-Shell Nanoparticles 100 mL of a DEG solution including 16 mmol of thiourea was added to 5 mmol of CuS nanoparticles synthesized according to Example 13 and then was heated to 100° C. or more. Subsequently, 50 mL of a DEG solution including 8 mmol of $Zn(OAc)_2$ was added dropwise thereto. Subsequently, maintaining the temperature, the resulting mixture was stirred for 3 hours. Formed particles were purified through centrifugation. As a result, ZnS shells were formed on surfaces of the CuS nanoparticles.

Manufacturing Example 22

Synthesis of $Cu_6Sn_5$ Particles

Under a nitrogen atmosphere, 200 mL of an aqueous solution, in which 150 mmol of $NaBH_4$ was dissolved, was strongly stirred while slowly adding dropwise 100 mL of an aqueous solution including 10 mmol of $SnCl_2$ and 12 mmol of $CuCl_2$. The resulting solution was reacted for 8 hours or more. Formed particles were purified through centrifugation. As a result, nanoparticles having a $Cu_6Sn_5$ composition were obtained. Scanning electron microscope (SEM) and transmission electron microscope (TEM) images of the formed particles are illustrated in FIGS. 17 and 18.

Example 1

Manufacturing Thin Film Using CuS-Core-ZnS-Shell Nanoparticles and $Cu_6Sn_5$ Nanoparticles CuS-core-ZnS-Shell nanoparticles manufactured according to Manufacturing Example 17 and $Cu_6Sn_5$ particles manufactured according to Manufacturing Example 22 were mixed. The resulting mixture was dispersed in an alcohol based solvent to manufacture an ink. Subsequently, the ink was coated on a glass substrate coated with molybdenum (Mo). The coated layer was dried and then heated with the glass substrate deposited with Se during rapid thermal annealing (RTA) at 575° C. so as to provide a Se atmosphere. As a result, a CZTSSe based thin film was manufactured. A scanning electron microscope (SEM) image and an X-ray diffraction (XRD) graph of the obtained thin film are illustrated in FIGS. 19 and 20.

Example 2

Manufacturing Thin Film Using CuS-Core-ZnS-Shell Nanoparticles and $Cu_6Sn_5$ Nanoparticles CuS-core-ZnS-Shell nanoparticles manufactured according to Manufacturing Example 19 and $Cu_6Sn_5$ particles manufactured according to Manufacturing Example 22 were mixed. The resulting mixture was dispersed in a solvent consisting of an alcohol based solvent to manufacture an ink. Subsequently, the ink was coated on a glass substrate coated with molybdenum (Mo). The coated layer was dried and then heated with the glass substrate deposited with Se during rapid thermal annealing (RTA) at 575° C. so as to provide a Se atmosphere. As a result, a CZTSSe based thin film was manufactured. A scanning electron microscope (SEM) image and an X-ray diffraction (XRD) graph of the obtained thin film are illustrated in FIGS. 21 and 22.

Comparative Example 1

Manufacturing Thin Film Using CuS, ZnS Nanoparticles and $Cu_6Sn_5$ Nanoparticles CuS nanoparticles and ZnS nanoparticles were synthesized respectively. The synthesized CuS and ZnS nanoparticles were mixed with $Cu_6Sn_5$ particles manufactured according to Manufacturing Example 22 and then were dispersed in an alcohol based mix solvent to manufacture an ink. The ink was coated on a glass substrate coated with molybdenum (Mo). The coated layer was dried and then heated with the glass substrate deposited with Se during rapid thermal annealing (RTA) at 575° C. so as to provide a Se atmosphere. As a result, a CZTSSe based thin film was manufactured. A scanning electron microscope (SEM) image of the obtained thin film is illustrated in FIGS. 23A-23D.

Experimental Example 1

Electron microscope images of thin films of Examples 1 and 2, and Comparative Example 1 were analyzed.

Referring to FIGS. 19, 21 and 23, a CZTSSe based thin film manufactured by using the ink composition according to the present invention showed more uniform composition and higher layer density, when compared to a film manufactured by an ink composition in which CuS nanoparticles and ZnS nanoparticles separately manufactured and then mixed. Such results are because oxidation of Cu and Zn is prevented and particles having a desired size are formed, and, accordingly, uniform mixing with nanoparticles including Sn may be easily performed and a uniform composition may be performed in a several hundred nanometer area.

Those skilled in the art will appreciate that various modifications, additions and substitutions are possible, without departing from the scope and spirit of the invention as disclosed in the accompanying claims.

INDUSTRIAL APPLICABILITY

As described above, according to the present invention, by manufacturing a light absorption layer using core-shell structure nanoparticles including a core including a copper (Cu)-containing chalcogenide and a shell including a zinc (Zn)-containing chalcogenide with tin (Sn)-containing bimetallic or intermetallic metal nanoparticles, or a tin (Sn)-containing chalcogenide nanoparticles, process costs may be reduced and stable processes are possible, and, as such, productivity may be increased.

In addition, the core-shell structure nanoparticles are stable against oxidation and have high reactivity. Thus, a light absorption layer for CZTS based solar cells having a superior quality film may be grown. As a result, photoelectric efficiency of a solar cell according to the present invention is increased.

The invention claimed is:

1. An ink composition for manufacturing a light absorption layer of solar cells comprising core-shell structure nanoparticles comprising a core comprising a copper (Cu)-containing chalcogenide and a shell comprising a zinc (Zn)-containing chalcogenide; and tin (Sn)-containing bimetallic or intermetallic metal nanoparticles, or a tin (Sn)-containing chalcogenide nanoparticles, dispersed in a solvent.

2. The ink composition according to claim 1, wherein the core has a diameter of 20 nanometers to 200 nanometers.

3. The ink composition according to claim 1, wherein the shell has a thickness of 1 nanometers to 75 nanometers.

4. The ink composition according to claim 1, wherein the copper (Cu)-containing chalcogenide is at least one selected from the group consisting of CuS, $Cu_xS$ wherein $1.7 \leq x \leq 2.0$, CuSe, and $Cu_ySe$ wherein $1.7 \leq y \leq 2.0$.

5. The ink composition according to claim 1, wherein the zinc (Zn)-containing chalcogenide is ZnS, and/or ZnSe.

6. The ink composition according to claim 1, wherein the tin (Sn)-containing bimetallic or intermetallic metal nanoparticles are $Cu_3Sn$ or $Cu_6Sn_5$.

7. The ink composition according to claim 1, wherein the tin (Sn)-containing chalcogenide nanoparticles are $Sn_zS$ wherein $0.5 \leq z \leq 2.0$ and/or $Sn_wSe$ wherein $0.5 \leq w \leq 2.0$.

8. The ink composition according to claim 1, wherein the core-shell structure nanoparticles; and tin (Sn)-containing bimetallic or intermetallic metal nanoparticles or tin (Sn)-containing chalcogenide nanoparticles, are mixed satisfying $0.5 < Cu/(Sn+Zn) < 1.4$.

9. The ink composition according to claim 1, wherein the solvent is at least one organic solvent selected from the group consisting of alkanes, alkenes, alkynes, aromatics, ketones, nitriles, ethers, esters, organic halides, alcohols, amines, thiols, carboxylic acids, phosphines, phosphates, sulfoxides, and amides.

10. The ink composition according to claim 1, wherein the ink composition further comprises an additive.

11. The ink composition according to claim 10, wherein the additive is at least one selected from the group consisting of polyvinylpyrrolidone (PVP), polyvinyl alcohol, Anti-terra 204, Anti-terra 205, ethyl cellulose, and DispersBYK110.

12. A method of synthesizing the core-shell structure nanoparticles according to claim 1, the method comprising:
preparing a first solution comprising at least one Group VI source selected from the group consisting of compounds comprising sulfur (S), or selenium (Se), or sulfur (S) and selenium (Se);
preparing a second solution comprising a copper (Cu) salt and a third solution comprising a zinc (Zn) salt;
mixing the first solution and second solution to manufacture a mixture;
synthesizing copper (Cu)-containing chalcogenide core particles through reaction of the mixture; and
forming and then purifying a shell by mixing the third solution with a product comprising the core particles of the synthesizing.

13. The method according to claim 12, wherein solvents of the first solution, second solution and third solution are at least one selected from the group consisting of water, methanol, ethanol, glycol class solvents, oleylamine, dimethyl sulfoxide and dimethyl formamide.

14. The method according to claim 13, wherein the glycol class solvents are at least one selected from the group consisting of ethylene glycol, diethylene glycol, NMP, diethylene glycol mono ethyl ether (DEGMEE) and triethylene glycol.

15. The method according to claim 12, wherein the salt is at least one type selected from the group consisting of chlorides, nitrates, nitrites, sulfates, acetates, sulfites, acetylacetonates and hydroxides.

16. The method according to claim 12, wherein the Group VI source is at least one selected from the group consisting of Se, $Na_2Se$, $K_2Se$, $Ca_2Se$, $(CH_3)_2Se$, $SeO_2$, $SeCl_4$, $H_2SeO_3$, $Na_2S$, $K_2S$, $Ca_2S$, $(CH_3)_2S$, $H_2SO_4$, S, $Na_2S_2O_3$, $NH_2SO_3H$ and hydrates thereof.

17. The method according to claim 12, wherein the Group VI source is at least one selected from the group consisting of thiourea, thioacetamide and selenourea.

18. The method according to claim 12, wherein, in the mixture of the mixing, the Group VI source is comprised in an amount of 0.5 mol to 4 mol based on 1 mol of the copper (Cu) salt.

19. The method according to claim 12, wherein, when the third solution is mixed, the Group VI source is further added to the product comprising the core particles of the synthesizing.

20. A method of manufacturing a thin film using the ink composition for manufacturing the light absorption layer of solar cells according to claim 1, the method comprising:
mixing core-shell structure nanoparticles; and tin (Sn)-containing bimetallic or intermetallic metal nanoparticles or tin (Sn)-containing chalcogenide nanoparticles, with a solvent to manufacture an ink composition;
coating the ink composition on a base provided with an electrode; and
drying and heat-treating the ink composition coated on the base provided with an electrode.

* * * * *